US011015086B2

(12) United States Patent
Matsuyama et al.

(10) Patent No.: US 11,015,086 B2
(45) Date of Patent: May 25, 2021

(54) POLISHING SLURRY AND POLISHING MATERIAL

(71) Applicant: Mitsui Mining & Smelting Co., Ltd., Tokyo (JP)

(72) Inventors: Masayuki Matsuyama, Fukuoka (JP); Akinori Kumagai, Fukuoka (JP)

(73) Assignee: Mitsui Mining & Smelting Co., Ltd.

( * ) Notice: Subject to any disclaimer, the term of this patent is extended or adjusted under 35 U.S.C. 154(b) by 0 days.

(21) Appl. No.: 16/067,380

(22) PCT Filed: Jan. 17, 2017

(86) PCT No.: PCT/JP2017/001342
§ 371 (c)(1),
(2) Date: Jun. 29, 2018

(87) PCT Pub. No.: WO2017/138308
PCT Pub. Date: Aug. 17, 2017

(65) Prior Publication Data
US 2019/0010359 A1 Jan. 10, 2019

(30) Foreign Application Priority Data

Feb. 9, 2016 (JP) .............................. JP2016-022997

(51) Int. Cl.
*H01L 29/20* (2006.01)
*H01L 29/16* (2006.01)
*H01L 21/306* (2006.01)
*H01L 21/02* (2006.01)
*C09K 3/14* (2006.01)
*C09G 1/04* (2006.01)
*C09G 1/02* (2006.01)
*C09G 1/00* (2006.01)
*B24B 37/00* (2012.01)

(52) U.S. Cl.
CPC ................ *C09G 1/02* (2013.01); *B24B 37/00* (2013.01); *C09G 1/00* (2013.01); *C09G 1/04* (2013.01); *C09K 3/14* (2013.01); *C09K 3/1454* (2013.01); *C09K 3/1463* (2013.01); *H01L 21/02024* (2013.01); *H01L 21/30625* (2013.01); *H01L 29/1608* (2013.01); *H01L 29/2003* (2013.01)

(58) Field of Classification Search
None
See application file for complete search history.

(56) References Cited

U.S. PATENT DOCUMENTS

| 6,589,100 B2* | 7/2003 | Moeggenborg | C09G 1/02 156/345.12 |
| 2008/0153292 A1* | 6/2008 | White | C09G 1/02 438/692 |
| 2010/0258528 A1* | 10/2010 | Singh | C09G 1/02 216/53 |
| 2014/0094032 A1 | 4/2014 | Yoshida et al. | |
| 2014/0187043 A1 | 7/2014 | Yoshida et al. | |
| 2014/0220299 A1* | 8/2014 | Yoshida | C30B 29/36 428/141 |
| 2014/0242750 A1 | 8/2014 | Sato et al. | |

FOREIGN PATENT DOCUMENTS

| CN | 101608098 A | 12/2009 |
| CN | 101684393 A | 3/2010 |
| JP | 2011-513991 A | 4/2011 |
| JP | 2012-248569 A | 12/2012 |
| JP | 2012-253259 A | 12/2012 |
| JP | 2015-229750 A | 12/2015 |
| WO | WO-2012-165376 A1 | 12/2012 |
| WO | WO-2013-035539 A1 | 3/2013 |
| WO | WO-2013-054883 A1 | 4/2013 |
| WO | WO-2013-161591 A1 | 10/2013 |

OTHER PUBLICATIONS

Hasegawa, Tadashi et al.: "Sanka Mangankei Slurry o Mochiita SiC Tankessho Kiban no Seimitsu Kako—Mippeigata Kako Kankyo Control CMP Sochi ni yoru Kako Tokusei", Proceedings of the Meeting of Japan Society of Precision Engineering, vol. 2011, Mar. 11, 2011 (Mar. 11, 2011), pp. 375 and 376, E33 (5 pages).

* cited by examiner

*Primary Examiner* — Stephanie P Duclair
(74) *Attorney, Agent, or Firm* — Harness, Dickey & Pierce, P.L.C.

(57) ABSTRACT

A polishing slurry according to the present invention contains: abrasive grains made of a metal oxide; a permanganate; and an inorganic compound other than the permanganate. The inorganic compound is such that a solution that is obtained by adding the inorganic compound to a 1.0 mass % aqueous solution of the permanganate so that the inorganic compound accounts for 1.0 mass % of the resultant aqueous solution has an oxidation-reduction potential higher than that of the 1.0 mass % aqueous solution of the permanganate. It is preferable that the inorganic compound be contained in an amount of 0.7 parts by mass or more and 150 parts by mass or less relative to 100 parts by mass of the permanganate. It is also preferable that the abrasive grains made of a metal oxide be manganese oxide particles.

8 Claims, No Drawings

POLISHING SLURRY AND POLISHING MATERIAL

CROSS-REFERENCE TO RELATED APPLICATIONS

This application is a U.S. National Stage Application of International Application No. PCT/JP2017/001342, filed on Jan. 17, 2017, and claims priority to Japanese Patent Application No. 2016-022997, filed on Feb. 9, 2016. The entire disclosures of the above applications are expressly incorporated herein by reference.

BACKGROUND

Technical Field

The present invention relates to a polishing slurry and a polishing material, and in particular to a polishing slurry and a polishing material that are used to polish a high-hardness material.

Related Art

For power semiconductor elements (i.e., so-called power devices) among semiconductor devices, it is proposed to use for their substrates silicon carbide, gallium nitride, diamond, or the like, instead of silicon conventionally used, in order to achieve high-voltage tolerance and large electric currents. Substrates made of silicon carbide or the like have a wider band gap than that of silicon substrates, and thus can withstand higher voltages. It is considered that the reason for high-voltage tolerance of substrates made of silicon carbide, gallium nitride, or the like is that the arrangement of atoms that constitute silicon carbide or the like is denser than that of silicon.

On the other hand, substrates made of silicon carbide, gallium nitride, or the like have, in particular, a high level of hardness. Accordingly, they can barely be polished using a conventionally used polishing material, which is problematic. As described above, silicon carbide and the like have a dense atomic arrangement, and thus have, in particular, a high level of hardness. Specifically, silicon carbide and gallium nitride each have a Mohs hardness of about 9, and diamond has a Mohs hardness of 10. When polishing such high-hardness materials, materials that have a high level of hardness such as diamond and aluminum oxide have been used also as abrasive particles. However, when a substrate is polished using diamond, for example, only mechanical polishing advances, which is likely to cause a defect and distortion in the substrate, and the resulting device may become unreliable. The harder a substrate is, more prominent this tendency becomes.

In order to address the problem described above, techniques has been proposed in which a high-hardness material such as silicon carbide is polished by using a slurry that contains a manganese oxide particle and permanganate ion (WO 2013/054883 A1 and WO 2013/161591 A1).

Another technique has also been proposed in which a high-hardness material such as silicon carbide is polished by using a polishing fluid that contains permanganate ion and an oxidizing inorganic salt (JP 2012-253259 A).

According to the techniques of WO 2013/054883 A1 and WO 2013/161591 A1, a high-hardness material such as silicon carbide or gallium nitride can be polished to a smooth finish at a high polishing rate, and the slurry can be used continuously in a recycled manner.

However, the desire to obtain substrates made of a high-hardness material more efficiently in short production process time has grown stronger in recent years, and there is a demand for further improvement in the polishing rate.

According to the technique disclosed in JP 2012-253259 A, a high polishing rate can be obtained, but there is still room for improvement in terms of the smoothness of the polished surface and performance degradation when the polishing fluid is used continuously in a recycled manner.

It is an object of the present invention to provide a polishing slurry, a polishing material, and a method for producing a polished article which overcome various disadvantages of the conventional techniques described above.

SUMMARY

The present invention provides a polishing slurry including:
abrasive grains made of a metal oxide;
a permanganate; and
an inorganic compound other than the permanganate,
wherein the inorganic compound is such that a solution that is obtained by adding the inorganic compound to a 1.0 mass % aqueous solution of the permanganate so that the inorganic compound accounts for 1.0 mass % of the resultant aqueous solution has an oxidation-reduction potential higher than that of the 1.0 mass % aqueous solution of the permanganate.

The present invention also provides a polishing material including:
a first agent that contains abrasive grains made of a metal oxide; and
a second agent that contains a permanganate,
wherein the second agent further contains an inorganic compound other than the permanganate, and
the inorganic compound is such that a solution that is obtained by adding the inorganic compound to a 1.0 mass % aqueous solution of the permanganate so that the inorganic compound accounts for 1.0 mass % of the resultant aqueous solution has an oxidation-reduction potential higher than that of the 1.0 mass % aqueous solution of the permanganate.

The present invention also provides a method for producing a polished article, including:
polishing a high-hardness material having a Mohs hardness of 8 or more as an article to be polished using the above-mentioned polishing slurry.

DETAILED DESCRIPTION OF THE PREFERRED EMBODIMENTS

Hereinafter, the present invention will be described by way of preferred embodiments. The present invention relates to a polishing slurry that contains: abrasive grains made of a metal oxide; and a permanganate, the polishing slurry further containing an inorganic compound other than permanganate. The present invention also relates to a polishing material for preparing the polishing slurry, the polishing material containing: a first agent that contains abrasive grains made of a metal oxide; and a second agent that contains a permanganate and an inorganic compound. The inorganic compound has the following property: when the inorganic compound is added to a 1.0 mass % aqueous solution of the permanganate such that the inorganic compound accounts for 1.0 mass % of the resultant aqueous solution, the resultant aqueous solution has a higher oxidation-reduction potential than that of the original 1.0 mass % aqueous solution of the permanganate.

As a metal oxide for the abrasive grains, a manganese oxide is preferably used. Examples of the manganese oxide include manganese oxide (II) (MnO), manganese sesquioxide (III) ($Mn_2O_3$), manganese dioxide (IV) ($MnO_2$), and trimanganese tetroxide (II, III) ($Mn_3O_4$). In particular, it is preferable to use manganese dioxide, which is highly oxidative. These may be used singly or in a combination of two or more.

A metal oxide other than the manganese oxide also can be used and examples thereof include alumina ($Al_2O_3$), silica ($SiO_2$), titanium oxide ($TiO_2$), and chromium oxide ($Cr2O_3$). These may be used singly or in a combination of two or more. In the present invention, the metal oxide for the abrasive grains may be a mixture of a plurality of oxides listed above. The abrasive grains also may contain other components as long as the properties of the metal oxides are not impaired. Alternatively, the abrasive grains may contain only inevitable impurities without the other components, the rest being a metal oxide that serves as the main component. In view of further improving the polishing performance, the content of the metal oxide in the abrasive grains is preferably 80 mass % or more, and more preferably 90 mass % or more.

In view of obtaining a stable polishing force, the abrasive grains made of a metal oxide preferably have an average particle size of 0.01 μm or more and 3.0 μm or less, and more preferably 0.05 μm or more and 1.0 μm or less. As used herein, the average particle size of the abrasive grains made of a metal oxide refers to the diameter at a cumulative volume of 50% ($d_{50}$) in a particle size distribution as measured using a laser diffraction/scattering method. To be specific, the average particle size is measured by using a method that will be described in Examples given later.

In view of increasing the polishing rate when polishing the high-hardness material using the polishing slurry according to the present invention, and ensuring preferred fluidity of the abrasive grains in the polishing slurry, the amount of abrasive grains made of a metal oxide in the polishing slurry is preferably 0.0001 mass % or more and 50 mass % or less, and more preferably 0.001 mass % or more and 40 mass % or less, even more preferably 0.01 mass % or more and 30 mass % or less, even much more preferably 0.1 mass % or more and 20 mass % or less, and most preferably 1 mass % or more and 10 mass % or less.

As is clear from Examples 10 and 11 given later, the polishing rate can be improved by using the additive according to the present invention even when the content of the abrasive grains is small.

In the polishing slurry according to the present invention, the abrasive grains made of a metal oxide are used as loose abrasive grains. Accordingly, a polished article having reduced surface roughness can be efficiently obtained while increasing the polishing rate, as compared with a case where loose abrasive grains are not used, for example, a case where fixed abrasive grains are used. Also, in the present invention, by using loose abrasive grains in combination with a specific additive, the polishing rate can be effectively prevented from decreasing when the polishing slurry is used continuously in a recycled manner.

As described above, the polishing slurry contains a permanganate, which serves as an oxidizing agent. The permanganate is a salt that supplies permanganate ion ($MnO_4^-$). Specific examples thereof include an alkali metal salt of permanganate, an alkaline earth metal salt of permanganate, and an ammonium salt of permanganate. In view of easy availability and improving the polishing efficiency of the polishing slurry according to the present invention, it is preferable to use an alkali metal salt of permanganate as the permanganate, and it is more preferable to use sodium permanganate or potassium permanganate. These may be used singly or in a combination of two or more.

In view of increasing the polishing rate by using the polishing slurry or the polishing material according to the present invention, ensuring handling safety of the polishing slurry, and the like, the amount of permanganate in the polishing slurry is preferably 0.1 mass % or more and 20.0 mass % or less, and more preferably 0.5 mass % or more and 5.0 mass % or less.

The inventors of the present invention have found that the addition of a specific additive to a polishing slurry that contains a permanganate and metal oxide abrasive grains significantly improves the polishing rate when polishing a high-hardness material such as silicon carbide or gallium nitride, in particular, the initial polishing rate at 1 hour after polishing is started.

As used herein, the term "specific additive" refers to an inorganic compound such that a solution that is obtained by adding the inorganic compound to a 1.0 mass % aqueous solution of the permanganate to be contained in the polishing slurry so that the inorganic compound accounts for 1.0 mass % of the resultant aqueous solution has an oxidation-reduction potential higher than that of the 1.0 mass % aqueous solution of the permanganate before adding the inorganic compound. Details of the reason why the present invention can provide such an effect by using the specific additive are unclear, but may be explained as follows. Specifically, polishing a high-hardness material using permanganate ions and metal oxide abrasive grains involves the process of oxidizing the high-hardness material with the permanganate ions and thereafter polishing the oxidized layer with the abrasive grains. The inventors of the present invention suppose that the oxidation process caused by the permanganate ions was a rate-limiting factor in conventional polishing, and that the specific additive promotes the oxidation process.

As used herein, the term "oxidation-reduction potential" refers to an electrode potential that is generated through electron exchange in an oxidation-reduction system, and is used as an indicator that quantitatively indicates the ease of emission or uptake of electrons by a substance. The oxidation-reduction potential according to the present invention is measured at 25° C. based on a silver/silver chloride electrode. The oxidation-reduction potential can be measured by using, for example, a method that will be described in examples given later.

Regarding the inorganic compound, a solution obtained by adding the inorganic compound to a 1.0 mass % aqueous solution of the permanganate such that the inorganic compound accounts for 1.0 mass % of the resultant aqueous solution has an oxidation-reduction potential higher than that of the aqueous solution of the permanganate before the inorganic compound is added, preferably by 10 mV or more, more preferably by 30 mV or more, and even more preferably by 50 mV or more. Also, in view of easy availability and material cost of the inorganic compound, regarding the inorganic compound, the difference between the oxidation-reduction potential of the solution obtained by adding 1.0 mass % of the inorganic compound to a 1.0 mass % aqueous solution of permanganate and the oxidation-reduction potential of the aqueous solution of permanganate before the inorganic compound is added is preferably 700 mV or less.

A 1.0 mass % aqueous solution of potassium permanganate normally has an oxidation-reduction potential at 25° C. of about 770 mV.

Examples of the inorganic compound such that a solution obtained by adding the inorganic compound to a 1.0 mass % aqueous solution of the permanganate so that the inorganic compound accounts for 1.0 mass % of the resultant aqueous solution has an oxidation-reduction potential higher than that of the original aqueous solution of the permanganate include nitric acid, an inorganic nitrate, a transition metal salt, an iron-containing complex, and a peroxo acid salt. These inorganic compounds have the following property: when any one of these inorganic compounds is added to a 1.0 mass % aqueous solution of a permanganate in an amount of 0.01 mass % or more, the resulting solution has an oxidation-reduction potential higher than that of the original aqueous solution of the permanganate. By adding the inorganic compound to the aqueous solution of a permanganate in an amount of 1.0 mass %, the influence of the inorganic compound on oxidation-reduction potential of the solution can be clearly seen. In the present invention, by adding the inorganic compound to the polishing slurry as described above, the following effects can be obtained in addition to improving the polishing rate mentioned above. The ion concentration in the polishing slurry increases, which decreases the freezing point of the slurry, and as a result, the slurry itself is unlikely to freeze. Accordingly, a risk that the slurry would freeze during transport or storage in winter is reduced, which facilitates quality control. In addition, the pH of the slurry varies according to the type of specific additive used, and thus even if there is a slight variation in the pH of pure water that is used for polishing, the influence thereof can be mitigated, which leads to the facilitation of daily process management.

The inorganic nitrate may be a metal nitrate or a metal nitrate complex. The metal nitrate may be represented by the following general formula: $M(NO_3)_a$, where M is a metal element, and a is the same number as the valence of the metal M. The valence of the metal M in the general formula is, for example, the valence in the case where the metal M acts as an oxidizing agent (electron acceptor). Specifically, for example, when the metal M is iron, the valence is 3, and when the metal M is cerium, the valence is 4. However, the valence of the metal M is not limited thereto, and the metal M may be divalent iron, trivalent cerium, or the like.

The metal nitrate complex may be a metal nitrate ammine complex, or the like. The metal nitrate ammine complex may be represented by, for example, the following general formula: $(NH_4)_p[M(NO_3)_q]$, where M is a metal element, q is 4 or 6, p is a number that satisfies the following equation: $p=q-b$, and b is the valence of the metal M. Normally, the valence of the metal M in the general formula is the valence in the case where the metal M acts as an oxidizing agent (electron acceptor), but the valence of the metal M is not limited thereto.

The inorganic nitrate preferably contains a transition metal. Examples of inorganic nitrate that contains a transition metal include a transition metal nitrate and a transition metal nitrate complex. Examples of the transition metal contained in the transition metal nitrate and the transition metal nitrate complex include: rare earth elements such as scandium (Sc), yttrium (Y), lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu); iron group elements such as iron (Fe), nickel (Ni), and cobalt (Co); and copper group elements such as copper (Cu). In view of easy availability and increasing the effect of improving the polishing rate obtained by using the specific additive, it is preferable to use a rare earth element as the transition metal. In particular, cerium (Ce) is preferable.

Preferred examples of the metal nitrate include: nitrates of a rare earth element such as scandium nitrate ($Sc(NO_3)_3$), yttrium nitrate ($Y(NO_3)_3$), lanthanum nitrate ($La(NO_3)_3$), cerium nitrate ($Ce(NO_3)_3$), cerium nitrate ($Ce(NO_3)_4$), praseodymium nitrate ($Pr(NO_3)_3$), neodymium nitrate ($Nd(NO_3)_3$), samarium nitrate ($Sm(NO_3)_3$), europium nitrate ($Eu(NO_3)_3$), gadolinium nitrate ($Gd(NO_3)_3$), terbium nitrate ($Tb(NO_3)_3$), dysprosium nitrate ($Dy(NO_3)_3$), holmium nitrate ($Ho(NO_3)_3$), erbium nitrate ($Er(NO_3)_3$), thulium nitrate ($Tm(NO_3)_3$), ytterbium nitrate ($Yb(NO_3)_3$), and lutetium nitrate ($Lu(NO_3)_3$; nitrates of an iron group element such as ferrous nitrate ($Fe(NO_3)_2$), ferric nitrate ($Fe(NO_3)_3$), nickel nitrate ($Ni(NO_3)_2$), cobaltous nitrate ($Co(NO_3)_2$), and cobaltic nitrate ($Co(NO_3)_3$); and nitrates of a copper group element such as cuprous nitrate ($Cu(NO_3)_2$), and cupric nitrate ($Cu(NO_3)_3$). Among these, it is preferable to use any of the nitrates of a rare earth element. Preferred examples of the metal nitrate complex include ammonium cerium nitrate (IV) ($(NH_4)_2[Ce(NO_3)_6]$). These may be anhydrides or hydrides. The metal nitrate and the metal nitrate complex herein may be in the form of a different compound as a result of a change of the valence of the metal and the like through oxidation of the metal nitrate and the metal nitrate complex with the permanganate in the polishing slurry or a second agent described later.

The transition metal salt may be a transition metal salt other than those corresponding to a nitrate, an iron-containing complex, or a peroxo acid salt. Examples include: transition metal halides such as a transition metal fluoride, a transition metal chloride, a transition metal bromide, and a transition metal iodide; a transition metal sulfate; and a transition metal acetate. Among these, preferred are the transition metal chloride and the transition metal sulfate. Normally, the valence of the transition metal in the transition metal salt is the valence in the case where the transition metal acts as an oxidizing agent (electron acceptor), but the valence of the transition metal is not limited thereto. Examples of the transition metal contained in the transition metal chloride and the transition metal sulfate are those listed above. Preferred examples of the transition metal chloride include: chlorides of a rare earth element such as scandium chloride ($ScCl_3$), yttrium chloride ($YCl_3$), lanthanum chloride ($LaCl_3$), cerium chloride ($CeCl_3$), praseodymium chloride ($PrCl_3$), neodymium chloride ($NdCl_3$), samarium chloride ($SmCl_3$), europium chloride ($EuCl_3$), gadolinium chloride ($GdCl_3$), terbium chloride ($TbCl_3$), dysprosium chloride ($DyCl_3$), holmium chloride ($HoCl_3$), erbium chloride ($ErCl_3$), thulium chloride ($TmCl_3$), ytterbium chloride ($YbCl_3$), and lutetium chloride ($LuCl_3$); chlorides of an iron group element such as ferrous chloride ($FeCl_2$), ferric chloride ($FeCl_3$), nickel chloride ($NiCl_2$), cobaltous chloride ($CoCl_2$), and cobaltic chloride ($CoCl_3$); and chlorides of a copper group element such as cuprous chloride ($CuCl_2$), and cupric chloride ($CuCl_3$). Preferred examples of the transition metal sulfate include: sulfates of a rare earth element such as scandium sulfate ($Sc(SO_4)_3$), yttrium sulfate ($Y(SO_4)_3$), lanthanum sulfate ($La(SO_4)_3$), cerium sulfate (III) ($Ce_2(SO_4)_3$), cerium sulfate (IV) ($Ce(SO_4)_2$), praseodymium sulfate ($Pr(SO_4)_3$), neodymium sulfate ($Nd(SO_4)_3$), samarium sulfate ($Sm(SO_4)_3$), europium sulfate ($Eu(SO_4)_3$), gadolinium sulfate ($Gd(SO_4)_3$), terbium sulfate ($Tb(SO_4)_3$), dysprosium sulfate ($Dy(SO_4)_3$), holmium sulfate (Ho(SO₄)₃), erbium sulfate (Er(SO₄)₃), thulium sulfate (Tm(SO₄)₃), ytterbium sulfate (Yb(SO₄)₃), and lutetium sulfate (Lu(SO₄)₃); sulfates of an iron group element such as ferrous sulfate (Fe(SO₄)₂), ferric sulfate (Fe(SO₄)₃), nickel sulfate (Ni(SO₄)₃), cobaltous sulfate (Co(SO₄)₂), and cobaltic sulfate (Co(SO₄)₃); and sulfates of a copper group element such as cuprous sulfate (Cu(SO₄)₂), and cupric sulfate (Cu(SO₄)₃). These may be anhydrides or hydrides. Herein, the transition metal salt other than those corresponding to a nitrate, an iron-containing complex, or a peroxo acid salts may be in the form of a different compound as a result of a change of the valence of the metal and the like through oxidation of the transition metal salt with a permanganate in the second agent.

The iron-containing complex may be a ferricyanide. Examples thereof include potassium ferricyanide ($K_3[Fe(CN)_6]$) and sodium ferricyanide ($Na_3[Fe(CN)_6]$). The peroxo acid salt may be a percarbonate, a perborate, or a persulfate.

The peroxo acid salt is preferably a persulfate in view of further improving the polishing rate by using the polishing slurry according to the present invention. Particularly, it is preferable to use an alkali metal persulfate, and in particular, potassium peroxodisulfate ($K_2S_2O_8$) or sodium peroxodisulfate ($Na_2S_2O_8$) is preferably used.

Among the specific additives described above, nitric acid or an inorganic nitrate that contains a transition metal is preferable because the effect of improving the polishing rate lasts for a long period of time when a high-hardness material is polished over a long period of time using the polishing slurry according to the present invention.

In view of further increasing the polishing rate using the polishing slurry or the polishing material according to the present invention, the amount of the inorganic compound as the specific additive is preferably 0.7 parts by mass or more relative to 100 parts by mass of the permanganate. If the inorganic compound is added in a greater amount, the effect of promoting oxidation of a high-hardness material with the permanganate is not further improved, and therefore the total amount of the inorganic compound is preferably 150 parts by mass or less relative to 100 parts by mass of the permanganate. The amount is more preferably 1.0 parts by mass or more and 120 parts by mass or less, even more preferably 2.0 parts by mass or more and 100 parts by mass or less, and even much more preferably 5.0 parts by mass or more and 50 parts by mass or less, relative to 100 parts by mass of the permanganate.

In view of increasing the effect of improving the polishing rate by using the specific inorganic compound, the content of the inorganic compound in the polishing slurry is preferably 0.01 mass % or more and 10.0 mass % or less, more preferably 0.02 mass % or more and 4.0 mass % or less, and even more preferably 0.05 mass % or more and 2.0 mass % or less.

In view of increasing the effect of improving the polishing rate by using the specific additive, the content of a dispersion medium, which will be described later, in the polishing slurry is preferably 60 mass % or more and 99.9 mass % or less, and more preferably 80 mass % or more and 98 mass % or less. Furthermore, from the same viewpoint, the content of components other than the abrasive grains, the permanganate, and the inorganic compound (also excluding the dispersion medium) in the polishing slurry is preferably 40 mass % or less, and more preferably 20 mass % or less.

Particularly when the polishing slurry or the polishing material according to the present invention contains nitric acid as the specific additive, the amount of nitric acid in the polishing slurry is preferably 0.01 mass % or more and 0.5 mass % or less, and more preferably 0.02 mass % or more and 0.3 mass % or less, in view of increasing the effect of improving the polishing rate by using the polishing slurry or the polishing material according to the present invention. The amount of nitric acid is determined using an ion chromatography method or an ultraviolet absorptiometry.

When the polishing slurry or the polishing material according to the present invention contains an inorganic nitrate as the specific additive, the amount of the inorganic nitrate in the polishing slurry is preferably 0.02 mass % or more and 1.0 mass % or less, more preferably 0.05 mass % or more and 0.7 mass % or less, and even more preferably 0.1 mass % or more and 0.5 mass % or less, in view of increasing the effect of improving the polishing rate by using the polishing slurry or the polishing material according to the present invention. The amount of inorganic nitrate is determined using X-ray fluorescence analysis (XRF), an inductively coupled plasma (ICP) optical emission spectroscopy, or the like.

When the polishing slurry or the polishing material according to the present invention contains, as the specific additive, a transition metal salt other than those corresponding to a nitrate, an iron-containing complex, or a peroxo acid salt, the amount of the transition metal salt in the polishing slurry is preferably 0.02 mass % or more and 1.0 mass % or less, and more preferably 0.04 mass % or more and 0.1 mass % or less, in view of increasing the effect of improving the polishing rate by using the polishing slurry or the polishing material according to the present invention. The amount of the transition metal salt is determined using X-ray fluorescence analysis (XRF), an inductively coupled plasma (ICP) optical emission spectroscopy, or the like.

When the polishing slurry or the polishing material according to the present invention contains an iron-containing complex as the specific additive, the amount of the iron-containing complex in the polishing slurry is preferably 0.02 mass % or more and 10 mass % or less, and more preferably 0.04 mass % or more and 2 mass % or less, in view of increasing the effect of improving the polishing rate by using the polishing slurry or the polishing material according to the present invention. The amount of the iron-containing complex is determined using X-ray fluorescence analysis (XRF), an inductively coupled plasma (ICP) optical emission spectroscopy, or the like.

When the polishing slurry or the polishing material according to the present invention contain a peroxo acid salt as the specific additive, the amount of the peroxo acid salt in the polishing slurry is preferably 0.02 mass % or more and 10 mass % or less, and more preferably 0.04 mass % or more and 2 mass % or less, in view of increasing the effect of improving the polishing rate by using the polishing slurry or the polishing material according to the present invention. The amount of the peroxo acid salt is determined using X-ray fluorescence analysis (XRF), an inductively coupled plasma (ICP) optical emission spectroscopy, or the like.

The pH of the polishing slurry before polishing is preferably 1.0 or more at 25° C. in view of handling safety and preventing corrosion of the polishing apparatus, and preferably 8.0 or less at 25° C. in view of handling safety. In view of the above, the polishing slurry preferably has a pH of 1.0 or more and 8.0 or less, and more preferably 2.0 or more and 8.0 or less before polishing. In most cases, the pH of the polishing slurry increases from neutral to alkaline during polishing due to the generation of hydroxide ions as a result of consumption of permanganate ions through polishing.

In view of increasing the oxidizing power of the slurry to thereby increase the effect of improving the polishing rate, the polishing slurry preferably has an oxidation-reduction potential at 25° C. of 700 mV or more before polishing. In view of material cost, the oxidation-reduction potential is preferably 1300 mV or less.

It is preferable that the polishing slurry according to the present invention be used without fixed abrasive grains. When using the polishing slurry without fixed abrasive grains, the surface roughness of the resulting polished article can be reduced while increasing the polishing rate, and the production cost can also be reduced.

Next, a polishing material according to the present invention will be described. The polishing material according to the present invention comprises separate agents, and abrasive grains made of a metal oxide and a permanganate, which are constituent components of the polishing slurry, are contained in the separate agents, respectively (hereinafter, the agent that contains abrasive grains made of a metal oxide may also be referred to as a "first agent", and the agent that contains a permanganate may also be referred to as a "second agent"). The polishing material according to the present invention may be provided in the form of a polishing kit, from which the polishing slurry according to the present invention is obtained by mixing the first agent and the second agent prior to use. With this configuration, polishing performance provided by the abrasive grains and the permanganate can be maintained until the polishing material is used. In the polishing material according to the present invention, the inorganic compound described above is contained in the agent that contains the permanganate, and accordingly, the influence of the inorganic compound on the abrasive grains can be suppressed. The first agent and the second agent may be mixed on the article to be polished or any other place, so as to obtain the polishing slurry according to the present invention. In the case where the first agent and the second agent are mixed on the article to be polished, for example, the permanganate and the inorganic compound are first brought into contact with the article to be polished, and the abrasive grains are then mixed with the permanganate and the inorganic compound, which are already in contact with the article to be polished. Alternatively, an agent containing the permanganate and the inorganic compound and an agent containing the abrasive grains may be mixed in a container or the like, and then brought into contact with a high-hardness material. In view of ease of production of the polishing material, the mass ratio of the first agent to the second agent is preferably 100:10 or more and 1000 or less.

The first agent preferably contains, in addition to the abrasive grains made of a metal oxide, a dispersion medium for dispersing the abrasive grains. The dispersion medium may be water, a water-soluble organic solvent such as alcohol or ketone, or a mixture thereof. The first agent may further contain an additive in addition to the abrasive grains and the dispersion medium as long as the polishing force of the polishing material according to the present invention is not impaired. Examples of the additive include a dispersing agent, a pH adjusting agent, a viscosity adjusting agent, a chelating agent, and an antirust agent. The content of abrasive grains in the first agent is preferably, but not limited to, 0.01 mass % or more and 50 mass % or less in view of, for example, preventing aggregation in the polishing slurry.

The second agent is obtained by dispersing or dissolving the permanganate and the specific additive in a dispersion medium. The dispersion medium may be water, a water-soluble organic solvent such as alcohol or ketone, or a mixture thereof. The second agent may further contain an additive in addition to the permanganate, the specific additive, and the dispersion medium as long as the polishing force of the polishing material according to the present invention is not impaired. Examples of the additive include a dispersing agent, a pH adjusting agent, a viscosity adjusting agent, a chelating agent, and an antirust agent. The content of the permanganate in the second agent is preferably, but not limited to, 0.01 mass % or more and 6.5 mass % or less in view of, for example, the ease of preparation of the polishing slurry. From the same viewpoint, the content of the inorganic compound in the second agent is preferably 40 mass % or less, and more preferably 20 mass % or less.

As described above, in the polishing material according to the present invention, the permanganate and the inorganic compound are contained in the same agent. However, the present invention also encompasses a polishing material for obtaining the polishing slurry according to the present invention, wherein the polishing material has a configuration that is different from the configuration composed of the first agent and the second agent described above. For example, the polishing slurry may be prepared by mixing components included in a kit in which the specific additive (i.e., the inorganic compound) is contained in a different agent from that containing the permanganate.

Furthermore, as described above, the present invention also provides a method for producing a polished article, the method including polishing an article to be polished by using the polishing slurry. The polishing material and the polishing slurry according to the present invention are preferably used to polish a high-hardness material having a Mohs hardness of 8 or more as an article to be polished. As used herein, Mohs hardness refers to a scale that quantifies hardness on the basis of scratching of standard substances. According to Mohs hardness, standard substances graded from 1 to 10, with 1 being softest, have been designated. To be specific, the standard substances are: talc for a Mohs hardness of 1; gypsum for a Mohs hardness of 2; calcite for a Mohs hardness of 3; fluorite for a Mohs hardness of 4; apatite for a Mohs hardness of 5; orthoclase for a Mohs hardness of 6; quartz for a Mohs hardness of 7; topaz for a Mohs hardness of 8; corundum for a Mohs hardness of 9; and diamond for a Mohs hardness of 10. Mohs hardness can be measured by using a conventional method using a Mohs hardness meter. Examples of high-hardness material having a Mohs hardness of 8 or more include silicon carbide, gallium nitride, and diamond. The method for producing a polished article according to the present invention can be applied to, for example, a final CMP (chemical mechanical polishing) process performed after a substrate made of a high-hardness material has been wrapped, or the like. The term "article to be polished" herein refers to a polish target article, and the term "polished article" refers to an article obtained as a result of polishing.

Examples of the polished article produced by using the polishing material or the polishing slurry according to the present invention include a SiC substrate for epitaxial growth, a SiC thin film epitaxially grown on a SiC substrate or a Si substrate, a SiC sintered compact, a GaN substrate, and a diamond substrate.

EXAMPLES

Hereinafter, the present invention will be described in further detail by way of examples. However, the scope of the present invention is not limited to the examples given below. Unless otherwise stated, "%" means "mass %".

Measurement of ORP of Additives 1 to 8

A 1.0% aqueous solution of potassium permanganate was prepared by adding potassium permanganate ($KMnO_4$) to pure water. Then, a specific additive listed in Table 1 was added in an amount of 1.0% to the aqueous solution prepared, to thereby obtain a solution. The pH and the oxidation-reduction potential (ORP) of the obtained solution were measured at 25° C. The ORP was measured by immersing an ORP electrode 9300-10D (available from Horiba, Ltd.) in the solution at a temperature of 25° C. pH was measured by using a pH electrode 9615S-10D (available from Horiba, Ltd.). The results are shown in Table 1. As shown in Table 1, it was confirmed that additives 1 to 8 each have the following property: when the additive is added to a 1.0% aqueous solution of a permanganate such that the additive accounts for 1.0% of the resultant aqueous solution, the resultant aqueous solution has an oxidation-reduction potential higher than that of the 1.0% aqueous solution of the permanganate in Reference Example 1.

Examples 1 to 8

Polishing slurries were prepared by mixing pure water in an amount of 950 to 952 g, 20 g of abrasive grains (average particle size $d_{50}$:0.4 µm) made of manganese dioxide ($MnO_2$), 28 g of potassium permanganate ($KMnO_4$), and any one of the specific additives listed in Table 2 below.

The amount of the specific additive in the polishing slurry (the content (%) of the specific additive relative to the polishing slurry) in each example is shown in Table 2. Table 2 shows the pH value at 25° C. and the ORP value of each polishing slurry at 25° C. The ORP was measured by immersing an ORP electrode 9300-10D (available from Horiba, Ltd.) in the polishing slurry at a temperature of 25° C. pH was measured by using a pH electrode 9615S-10D (available from Horiba, Ltd.). In each example, the amount of the abrasive grains of manganese dioxide in the polishing slurry was 2.0%, and the amount of potassium permanganate ($KMnO_4$) in the polishing slurry was 2.8%.

Example 9

A mixture obtained by mixing 80 g of pure water with 20 g of abrasive grains (average particle size $d_{50}$: 0.4 µm) made of manganese dioxide ($MnO_2$) was used as the first agent. A mixture obtained by mixing 870 g of pure water with 28 g of potassium permanganate ($KMnO_4$) and additive 1 shown in Table 1, which was the same specific additive as that used in Example 1, was used as the second agent.

Then, a polishing slurry was prepared by mixing the first agent and the second agent. Table 2 shows the pH value and the oxidation-reduction potential (ORP) value of the polishing slurry at 25° C. The ORP value and the pH value were measured in the same manner as in Examples 1 to 8. The amount of abrasive grains of manganese dioxide in the first agent corresponded to 2.0% based on the polishing slurry, and the amount of potassium permanganate ($KMnO_4$) in the second agent corresponded to 2.8% based on the polishing slurry. Also, the amount of the specific additive in the polishing slurry is shown in Table 2 below.

Examples 10 and 11

Polishing slurries were prepared in the same manner as in Example 2, except that the amount of abrasive grains of manganese dioxide ($MnO_2$) was changed to 1 g in Example 10, and 0.01 g in Example 11, and that the amount of the additive was changed as shown in Table 2. The results are shown in Table 2.

Comparative Example 1

A polishing slurry was prepared in the same manner as in Examples 1 to 8, except that a specific additive was not used. The results are shown in Table 2.

Comparative Example 2

A polishing slurry was prepared with reference to the examples disclosed in JP 2012-253259 A. Specifically, the polishing slurry was prepared in the same manner as in Example 2, except that abrasive grains made of manganese dioxide ($MnO_2$) were not mixed, and that the amount of additive was changed as shown in Table 2. The results are shown in Table 2.

Polishing was conducted according to Polishing Test 1 below using any one of the polishing slurries obtained in Examples and Comparative Examples, and the polishing rate (nm/min) and the surface roughness Ra were determined one hour after the start of polishing. The results are shown in Table 2.

The average particle size $d_{50}$ was measured by using a laser diffraction/scattering particle size distribution analyzer LA-920 (available from Horiba, Ltd.). Before the measurement, an ultrasonic dispersion process (30 W) was carried out for three minutes so as to disperse oxide particles. For the measurement, an aqueous solution of sodium hexametaphosphate was used as a liquid medium for dispersing particles.

Polishing Test 1

Polishing was performed in the following manner by using the polishing slurry obtained above. As the polish target, a wrapped 4H—SiC substrate having a diameter of 3 inches and an off-angle of 4° was used. Polishing was performed on the Si face of the substrate. As the polishing apparatus, a single sided polishing system BC-15 available from MAT, Inc. was used. As the polishing pad attached to the platen, a polishing pad SUBA #600 (available from Nitta Haas, Inc.) was used. The rotation speed of the platen was set to 60 rpm, and the outer circumferential speed was set to 7163 cm/min. The carrier rotation speed was set to 60 rpm, and the outer circumferential speed was set to 961 cm/min. The load applied during polishing was set to 3 psi (about $2.07 \times 10^4$ Pa). The polishing slurry fluid was supplied at a rate of 200 mL/min. The polishing rate (nm/min) was determined based on the difference in mass of the substrate before and after polishing and the SiC density (3.10 g/cm³). The results are shown in Table 2.

After CMP had been carried out in Polishing Test 1 described above, the surface roughness Ra of the substrate was measured in accordance with JIS B0601: 2013 "Arithmetic Mean Roughness Ra", and the obtained surface roughness was used as an indication of polishing performance. To be specific, measurement was performed at five points on the surface of the substrate by using a white light interferometer (NewView 7300) available from ZYGO Corporation, and the average of the obtained values was calculated as Ra. The measurement was performed under the following conditions: objective lens: 50 times magnification, measurement area: 0.14 mm×0.11 mm, number of averaging: 16, lower limit of high-pass filter: 27.5 µm, and filter type: gauss spline. The results are shown in Table 2.

TABLE 1

| | Specific additive Type | ORP (1)* (mV) | ΔORP** (mV) | pH |
|---|---|---|---|---|
| Additive 1 | $K_3[Fe(CN)_6]$ | 822 | 52 | 7.93 |
| Additive 2 | $(NH_4)_2[Ce(NO_3)_6]$ | 1291 | 521 | 1.13 |
| Additive 3 | $K_2S_2O_8$ | 964 | 194 | 4.52 |
| Additive 4 | $FeCl_2$ | 1184 | 414 | 1.70 |
| Additive 5 | $Ce(NO_3)_3$ | 1227 | 457 | 1.62 |
| Additive 6 | $Ce(SO_4)_2$ | 1259 | 489 | 1.16 |
| Additive 7 | $Ce_2(SO_4)_3$ | 1212 | 442 | 1.52 |
| Additive 8 | Nitric acid | 1249 | 479 | 0.76 |
| Reference Example 1 | None | 770 | — | 7.45 |

*ORP (1): ORP value obtained when a specific additive was added to a 1.0 mass % aqueous solution of $KMnO_4$ such that the specific additive accounted for 1.0 mass % of the resultant aqueous solution.
**ΔORP: the difference between ORP (1) and ORP in Reference Example 1, in which no additive was contained.

TABLE 2

| | Abrasive grains | | Specific additive | | | ORP (2)* (mV) | Polishing rate after 1 hour (nm/min) | Surface roughness after 1 hour (nm) |
|---|---|---|---|---|---|---|---|---|
| | Type | Content (%) | Type | Content (%) | pH | | | |
| Example 1 | $MnO_2$ | 2.0 | Additive 1 $K_3[Fe(CN)_6]$ | 0.20 | 6.67 | 834 | 16.35 | 0.131 |
| Example 2 | $MnO_2$ | 2.0 | Additive 2 $(NH_4)_2[Ce(NO_3)_6]$ | 0.07 | 4.63 | 967 | 17.60 | 0.135 |
| Example 3 | $MnO_2$ | 2.0 | Additive 3 $K_2S_2O_8$ | 2.00 | 4.29 | 962 | 17.55 | 0.137 |
| Example 4 | $MnO_2$ | 2.0 | Additive 4 $FeCl_2$ | 0.10 | 3.03 | 1085 | 17.15 | 0.133 |
| Example 5 | $MnO_2$ | 2.0 | Additive 5 $Ce(NO_3)_3$ | 0.10 | 3.10 | 1119 | 17.60 | 0.135 |
| Example 6 | $MnO_2$ | 2.0 | Additive 6 $Ce(SO_4)_2$ | 0.04 | 4.28 | 1046 | 17.83 | 0.128 |
| Example 7 | $MnO_2$ | 2.0 | Additive 7 $Ce_2(SO_4)_3$ | 0.06 | 4.76 | 1037 | 16.81 | 0.132 |
| Example 8 | $MnO_2$ | 2.0 | Additive 8 Nitric acid | 0.02 | 4.03 | 1092 | 17.37 | 0.129 |
| Example 9 | $MnO_2$ | 2.0 | Additive 1 $K_3[Fe(CN)_6]$ | 0.20 | 6.59 | 842 | 16.73 | 0.134 |
| Example 10 | $MnO_2$ | 0.1 | Additive 2 $(NH_4)_2[Ce(NO_3)_6]$ | 0.23 | 1.99 | 1153 | 17.26 | 0.146 |
| Example 11 | $MnO_2$ | 0.001 | Additive 2 $(NH_4)_2[Ce(NO_3)_6]$ | 0.23 | 1.97 | 1180 | 16.58 | 0.151 |
| Comp. Ex. 1 | $MnO_2$ | 2.0 | — — | — | 7.47 | 793 | 15.10 | 0.133 |
| Comp. Ex. 2 | — | — | Additive 2 $(NH_4)_2[Ce(NO_3)_6]$ | 0.23 | 1.90 | 1230 | 16.69 | 0.162 |

*ORP (2): ORP value of the polishing slurry of each example

As clear from the results shown in Table 2, the polishing rate one hour after the start of polishing was improved significantly in Examples, in which the polishing slurry contained a specific additive in addition to a permanganate, as compared with Comparative Example 1, in which only a permanganate was used as an oxidizing agent. In particular, in Examples 10 and 11, despite the fact that the abrasive grain concentration was much lower than that in Comparative Example 1, the polishing rate one hour after the start of polishing was higher than that in Comparative Example 1. Also, in Examples, the surface roughness one hour after the start of polishing was enhanced significantly as compared with that in Comparative Example 2, in which abrasive grains were not contained. Accordingly, with the polishing slurry and the polishing material according to the present invention, it is possible to improve the polishing efficiency, in particular, the initial polishing efficiency, and obtain excellent surface smoothness as compared with conventional polishing slurries and polishing materials. In addition, with the polishing slurry of Example 9, which was obtained by mixing the first agent that contained abrasive grains made of a metal oxide and the second agent that contained a permanganate, the effect of improving the polishing rate was obtained.

Polishing Test 2

The polishing was continued by using any one of the polishing slurries of Examples 2, 5, 8, 10 and 11, as well as the polishing slurries of Comparative Examples 1 and 2 even after one hour passed from the start of polishing in Polishing Test 1. Then, the polishing rate (nm/min) 8 hours after the start of polishing and that 24 hours after the start of polishing were determined in the same manner as in Polishing Test 1. The results are shown in Table 3.

TABLE 3

| | Polishing rate after 8 hours (nm/min) | Polishing rate after 24 hours (nm/min) |
|---|---|---|
| Example 2 | 10.56 | 4.50 |
| Example 5 | 11.19 | 6.22 |
| Example 8 | 12.66 | 6.90 |
| Example 10 | 10.11 | 2.27 |
| Example 11 | 7.67 | 2.21 |

TABLE 3-continued

| | Polishing rate after 8 hours (nm/min) | Polishing rate after 24 hours (nm/min) |
|---|---|---|
| Comparative Example 1 | 8.74 | 2.16 |
| Comparative Example 2 | 5.68 | 2.04 |

As clear from the results shown in Table 3, in Examples 2, 5 and 8, in which a specific additive was used in addition to a permanganate, the polishing rate 8 hours after the start of polishing and the polishing rate 24 hours after the start of polishing were improved significantly as compared with those in Comparative Example 1, in which only a permanganate was used as an oxidizing agent, and Comparative Example 2, in which abrasive grains were not contained. In Examples 10 and 11, in which the abrasive grain concentration was lower than that of Example 2 and Comparative Example 1, the polishing rate 24 hours after the start of polishing was almost the same as those in Comparative Examples 1 and 2. However, in Examples 10 and 11, the polishing rate 8 hours after the start of polishing was improved significantly as compared with that in Comparative Example 2, in which abrasive grains were not contained, and almost the same as or higher than that in Comparative Example 1, in which the abrasive grain concentration was higher than those in Examples 10 and 11 without any specific additive. Thus, the polishing slurry and the polishing material according to the present invention can maintain the effect of improving polishing efficiency over a longer period of time as compared with conventional polishing slurries and polishing materials. Furthermore, it is possible to reduce the frequency of replacing the polishing fluid, which takes a long time during the operation of polishing silicon carbide, gallium nitride, or the like, and thus the polishing slurry and the polishing material according to the present invention have the effect of further improving the productivity of the polishing operation.

INDUSTRIAL APPLICABILITY

According to the present invention, there is provided a technique for polishing a high-hardness material such as silicon carbide or gallium nitride by using a polishing slurry that contains abrasive grains made of a metal oxide, and a permanganate. Using to the technique according to the present invention, the polishing rate can be further improved, and the effect of improving polishing efficiency when polishing is performed continuously can also be maintained over a long period of time.

The invention claimed is:

1. A polishing slurry comprising:
abrasive grains made of manganese oxide particles, wherein an amount of the abrasive grains in the polishing slurry is 1 mass % or more and 10 mass % or less;
a permanganate; and
an inorganic compound, wherein the inorganic compound includes one or more of cerium nitrate ($Ce(NO_3)_3$) and cerium sulfate (IV) ($Ce(SO_4)_2$), wherein an amount of the one or more of cerium nitrate ($Ce(NO_3)_3$) and cerium sulfate (IV) ($Ce(SO_4)_2$) in the polishing slurry is 0.02 mass % or more and 1.0 mass % or less, and wherein the amount of the one or more of cerium nitrate ($Ce(NO_3)_3$) and cerium sulfate (IV) ($Ce(SO_4)_2$) is 1.0 parts by mass or more and 50 parts by mass or less relative to 100 parts by mass of the permanganate,
wherein the inorganic compound is such that a solution that is obtained by adding the inorganic compound to a 1.0 mass % aqueous solution of the permanganate so that the inorganic compound accounts for 1.0 mass % of the resultant aqueous solution has an oxidation-reduction potential higher than that of the 1.0 mass % aqueous solution of the permanganate, and
wherein the polishing slurry has an oxidation-reduction potential of 25° C. of 700 mV or more and 1300 mV or less.

2. The polishing slurry as set forth in claim 1, wherein the polishing slurry has a pH at 25° C. of 1.0 or more and 8.0 or less before polishing.

3. The polishing slurry as set forth in claim 1, wherein the polishing slurry is used in polishing that does not use fixed abrasive grains.

4. The polishing slurry as set forth in claim 1, wherein the inorganic compound further includes one or more transition metal chlorides including one or more of rare earth elements selected from the group consisting of: scandium chloride ($ScCl_3$), yttrium chloride ($YCl_3$), lanthanum chloride ($LaCl_3$), cerium chloride ($CeCl_3$), praseodymium chloride ($PrCl_3$), neodymium chloride ($NdCl_3$), samarium chloride ($SmCl_3$), europium chloride ($EuCl_3$), gadolinium chloride ($GdCl_3$), terbium chloride ($TbCl_3$), dysprosium chloride ($DyCl_3$), holmium chloride ($HoCl_3$), erbium chloride ($ErCl_3$), thulium chloride ($TmCl_3$), ytterbium chloride ($YbCl_3$), lutetium chloride ($LuCl_3$), and combinations thereof.

5. The polishing slurry as set forth in claim 1, wherein the inorganic compound further includes one or more transition metal sulfates including one or more of rare earth elements selected from the group consisting of: scandium sulfate ($Sc(SO_4)_3$), yttrium sulfate ($Y(SO_4)_3$), lanthanum sulfate ($La(SO_4)_3$), praseodymium sulfate ($Pr(SO_4)_3$), neodymium sulfate ($Nd(SO_4)_3$), samarium sulfate ($Sm(SO_4)_3$), europium sulfate ($Eu(SO_4)_3$), gadolinium sulfate ($Gd(SO_4)_3$), terbium sulfate ($Tb(SO_4)_3$), dysprosium sulfate ($Dy(SO_4)_3$), holmium sulfate ($Ho(SO_4)_3$), erbium sulfate ($Er(SO_4)_3$), thulium sulfate ($Tm(SO_4)_3$), ytterbium sulfate ($Yb(SO_4)_3$), lutetium sulfate ($Lu(SO_4)_3$), and combinations thereof.

6. The polishing slurry as set forth in claim 1, wherein the content of the manganese oxide in the abrasive grains is 90 mass % or more.

7. A method for producing a polished article, comprising:
polishing a high-hardness material having a Mohs hardness of 8 or more as an article to be polished using:
a first polishing slurry including:
abrasive grains made of manganese oxide particles wherein an amount of the abrasive grains in the polishing slurry is 1 mass % or more and 10 mass % or less;
a first permanganate; and
a first inorganic compound, wherein the first inorganic compound includes one or more of cerium nitrate ($Ce(NO_3)_3$) and cerium sulfate (IV) ($Ce(SO_4)_2$), wherein an amount of the one or more of cerium nitrate ($Ce(NO_3)_3$) and cerium sulfate (IV) ($Ce(SO_4)_2$) in the polishing slurry is 0.02 mass % or more and 1.0 mass % or less, and wherein the amount of the one or more of cerium nitrate ($Ce(NO_3)_3$) and cerium sulfate (IV) ($Ce(SO_4)_2$) is 1.0 parts by mass or more and 50 parts by mass or less relative to 100 parts by mass of the permanganate,
wherein the first inorganic compound is such that a solution that is obtained by adding the first inorganic compound to a 1.0 mass % aqueous solution of the first permanganate so that the first inorganic compound accounts for 1.0 mass % of the resultant aqueous solution has an oxidation-reduction potential higher than that of the 1.0 mass % aqueous solution of the first permanganate, and
wherein the polishing slurry has an oxidation-reduction potential of 25° C. of 700 mV or more and 1300 mV or less.

8. The method for producing a polished article as set forth in claim 7, wherein fixed abrasive grains are not used.

* * * * *